(12) United States Patent
Nakagawa

(10) Patent No.: US 10,564,502 B1
(45) Date of Patent: Feb. 18, 2020

(54) DISPLAY DEVICE

(71) Applicant: Panasonic Liquid Crystal Display Co., Ltd., Hyogo (JP)

(72) Inventor: Teruhisa Nakagawa, Hyogo (JP)

(73) Assignee: PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 0 days.

(21) Appl. No.: 16/234,018

(22) Filed: Dec. 27, 2018

(51) Int. Cl.
| | |
|---|---|
| H01L 27/14 | (2006.01) |
| G02F 1/1362 | (2006.01) |
| G02F 1/1368 | (2006.01) |
| H01L 27/12 | (2006.01) |
| G09G 3/36 | (2006.01) |

(52) U.S. Cl.
CPC ...... *G02F 1/136286* (2013.01); *G02F 1/1368* (2013.01); *G02F 1/136209* (2013.01); *G02F 1/136227* (2013.01); *G09G 3/3677* (2013.01); *H01L 27/124* (2013.01); *G02F 2201/121* (2013.01); *G09G 2300/0426* (2013.01)

(58) Field of Classification Search
CPC ............ H01L 27/124; G02F 1/136286; G02F 1/136209; G02F 1/1368
USPC ............................................ 257/59, 72, 432
See application file for complete search history.

(56) References Cited

U.S. PATENT DOCUMENTS

| | | | |
|---|---|---|---|
| 2008/0018583 A1 | 1/2008 | Knapp et al. | |
| 2019/0129538 A1* | 5/2019 | Yoshida | .................. G06F 3/044 |

FOREIGN PATENT DOCUMENTS

JP          2008-501138          1/2006

* cited by examiner

*Primary Examiner* — Tan N Tran
(74) *Attorney, Agent, or Firm* — Hamre, Schumann, Mueller & Larson, P.C.

(57) ABSTRACT

A display device includes: gate signal lines extending in a first direction; data signal lines extending in a second direction; gate lead lines extending in the second direction and respectively connected to the gate signal lines; pixel electrodes electrically connected to the data signal lines, respectively; and a common electrode opposed to the plurality of pixel electrode. Each one of gate lead lines is disposed between two neighboring ones of the data signal lines. A first opening is provided for a first area of the common electrode, and the first area overlaps one of the gate signal lines, and is between the one of the gate lead lines and a one of the two neighboring data signal lines that is closer to the one of the gate lead lines than is the other one of the two neighboring data signal lines.

10 Claims, 5 Drawing Sheets

DISPLAY DEVICE

TECHNICAL FIELD

The present invention relates to a display device.

BACKGROUND

A display device includes wirings such as data signal lines and gate signal lines, and thin film transistors. The display device further includes source drivers supplying data signal with the data signal lines and gate drivers supplying gate signal with the gate signal lines.

Recently, in a narrow bezel technology, source drivers and gate drivers are mounted on only one edge of the display device in order to obtain a narrow bezel (see, unexamined patent publication JP2008-501138A1).

In the narrow bezel technology, the display device further includes gate lead lines extending in the column direction so as to electrically connect the gate drivers to the gate signal lines respectively. The gate lead lines are connected to the gate signal lines through contact holes respectively.

SUMMARY

In the narrow bezel technology, a length of the gate lead lines is so long because the distance between the gate driver and the gate signal lines is long. In this case, a timing of driving thin film transistors tends to be late due to a delay of gate signal from the gate driver.

This present disclosure provides a display device in which a delay of gate signal from the gate driver can be improved.

To solve above problem, a display device according to the present disclosure includes: a plurality of gate signal lines extending in a first direction; a plurality of data signal lines extending in a second direction different from the first direction; a plurality of gate lead lines extending in the second direction and respectively connected to a corresponding one of the plurality of gate signal lines; a plurality of pixel electrodes electrically connected to the plurality of data signal lines through a plurality of thin film transistors, respectively; and a common electrode opposed to the plurality of pixel electrodes and extending across the plurality of pixel electrode, wherein one of the plurality of gate lead lines is disposed between two neighboring data signal lines among the plurality of data signal lines, and a first opening is provided for a first area of the common electrode, and the first area overlaps one of the plurality of gate signal lines, and is between the one of a plurality of gate lead lines and one of the two neighboring data signal lines closer to the one of a plurality of gate lead lines than the other one of the two neighboring data signal lines.

DETAILED DESCRIPTION

Figure 1:
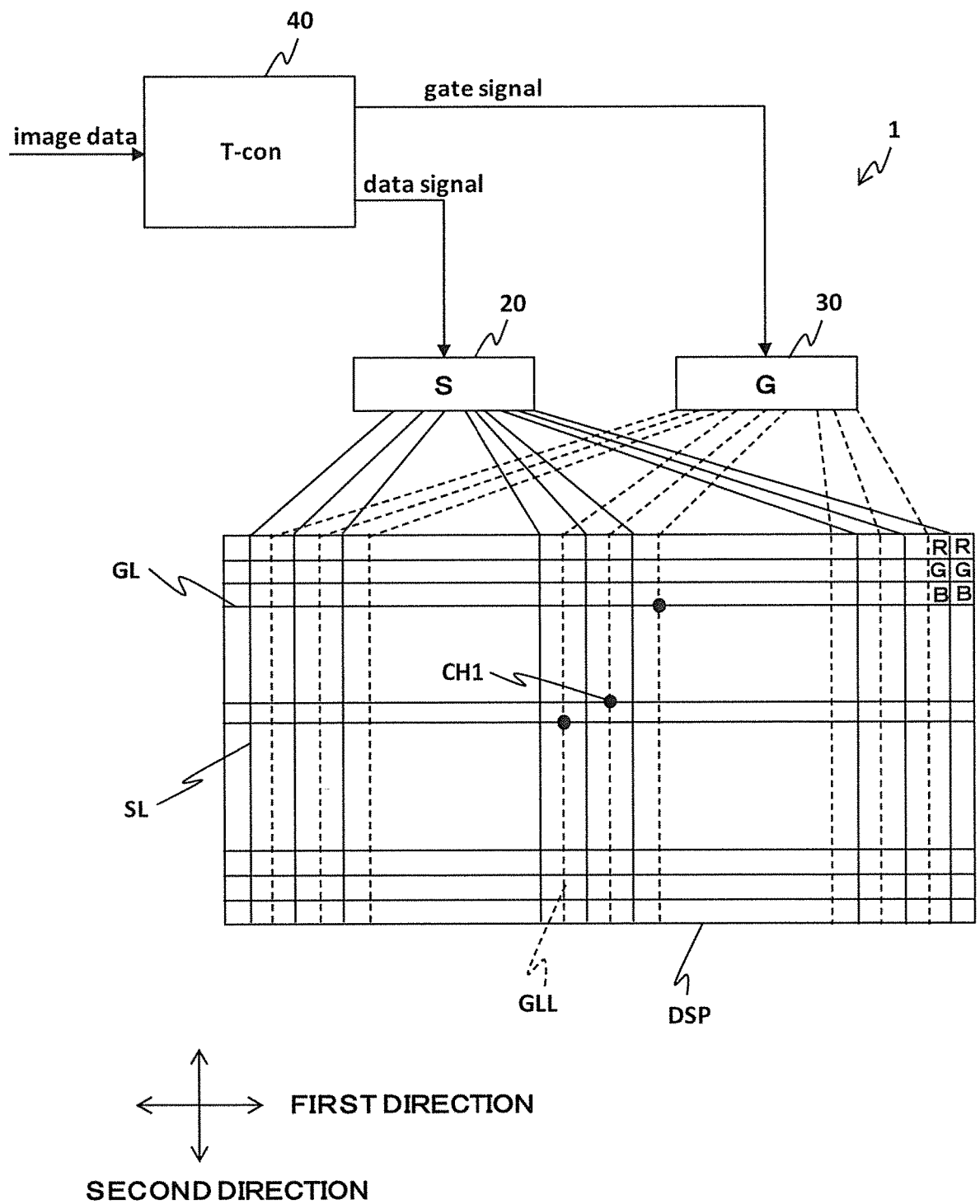
FIG. 1 is a view illustrating a schematic configuration of a display device according to an exemplary embodiment.
Figure 2:
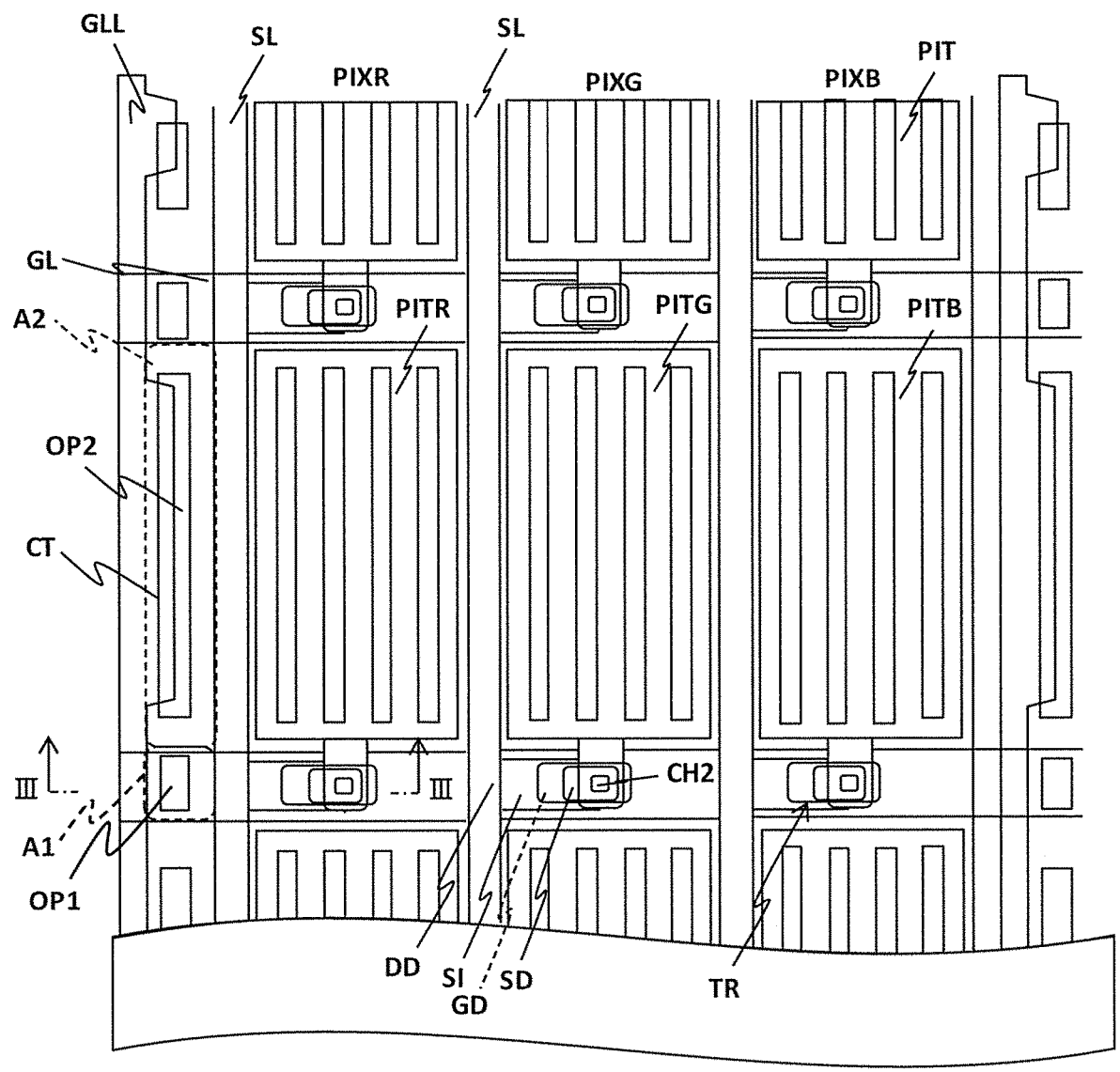
FIG. 2 is a plan view illustrating a configuration of a pixel in the display device of the exemplary embodiment.
Figure 2:
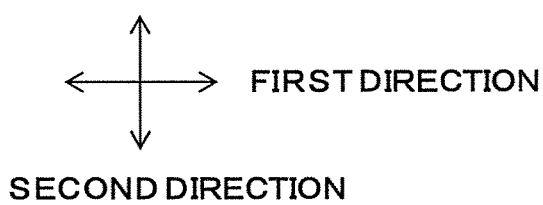

FIG. 1 is a view illustrating a schematic configuration of a display device 1 according to an exemplary embodiment. FIG. 2 is a plan view illustrating a configuration of a pixel PIX in the display device 1 of the exemplary embodiment. The display device 1 shown in FIGS. 1 and 2 displays a color image or a monochrome image in an image display region DSP. The display device 1 is an example of a liquid crystal display device that displays a still image or a moving image.

Figure 3:
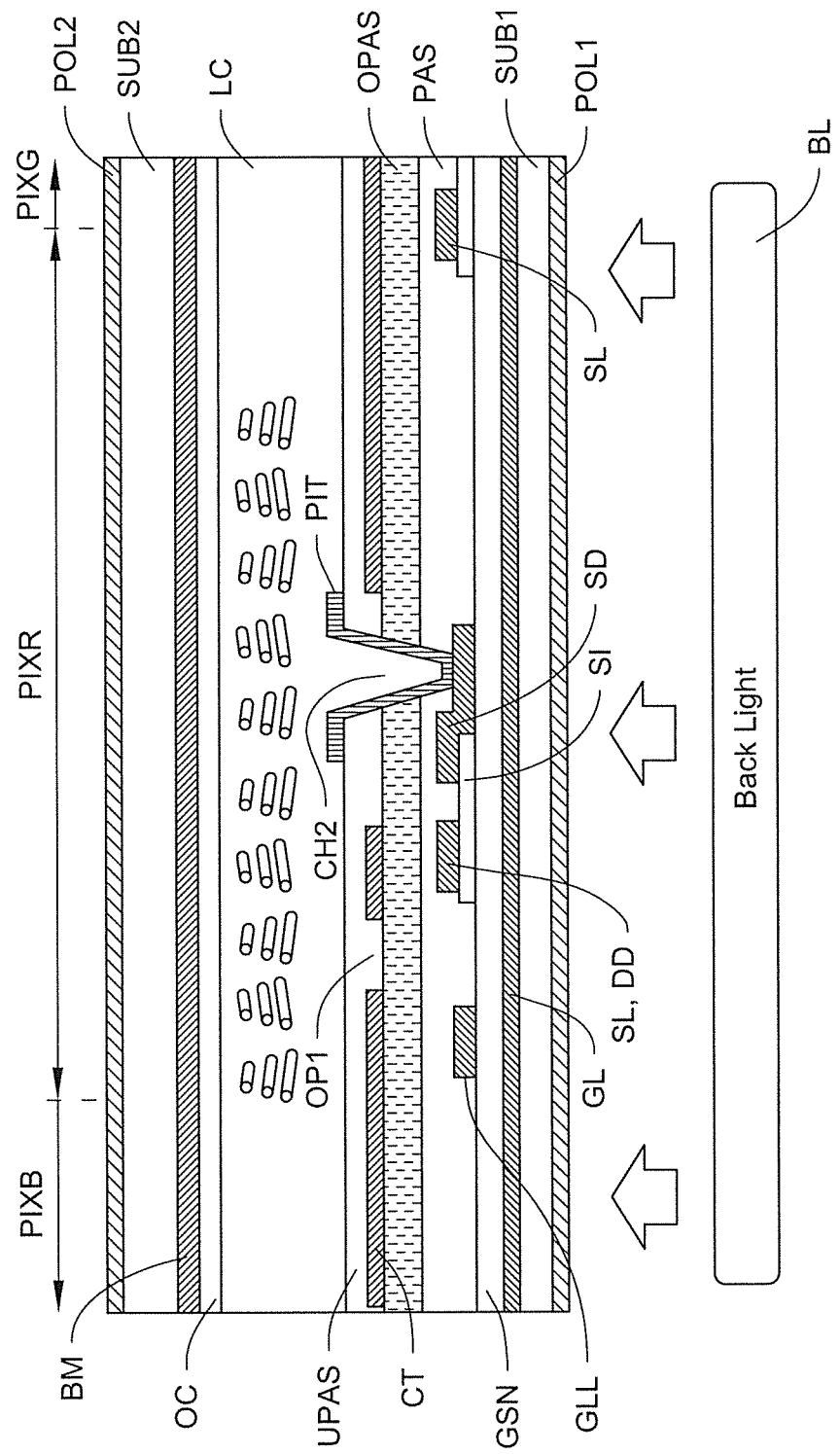
FIG. 3 is a sectional view taken along a line in FIG. 2.

The display device 1 includes a liquid crystal cell which includes a liquid crystal layer LC disposed between a pair of transparent substrates SUB1, SUB2, and a pair of polarizers POL1, POL2 sandwiching the liquid crystal cell (see, FIG. 3). One of the pair of transparent substrates is a thin film transistor (TFT) substrate SUB1 on which thin film transistors TR and wirings are disposed. The other of the pair of transparent substrates is a CF substrate SUB2 on which color filters are disposed. For example, a system for driving the display device 1 is a transverse electric field system such as an in-plane switching system (IPS) or a fringe field switching system (FFS). However, a system for driving the display device 1 also can be a vertical alignment system or twisted nematic system.

Figure 4:
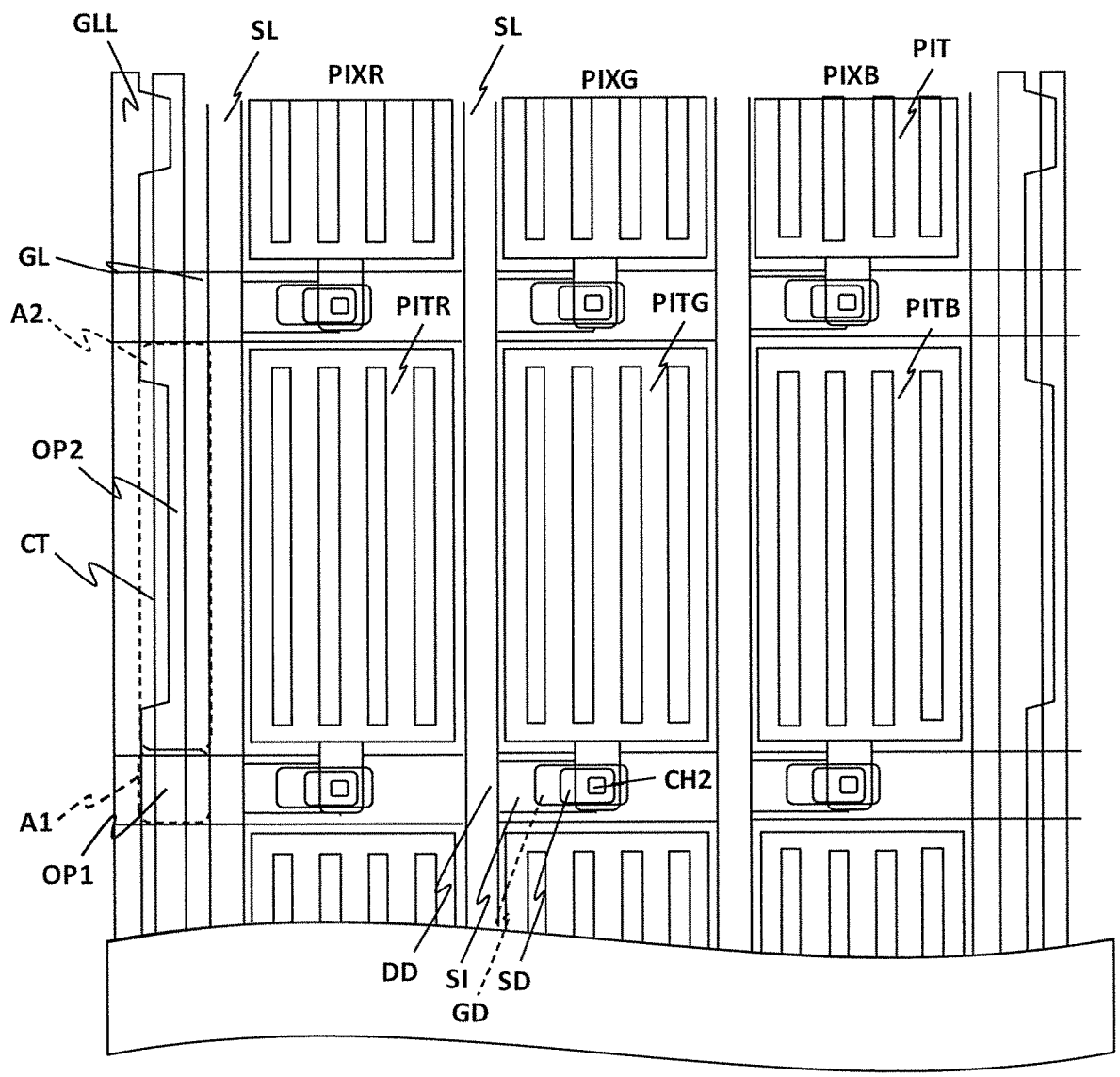
FIG. 4 is a plan view illustrating a configuration of a pixel in a first variation of the display device according to the exemplary embodiment.
Figure 5:
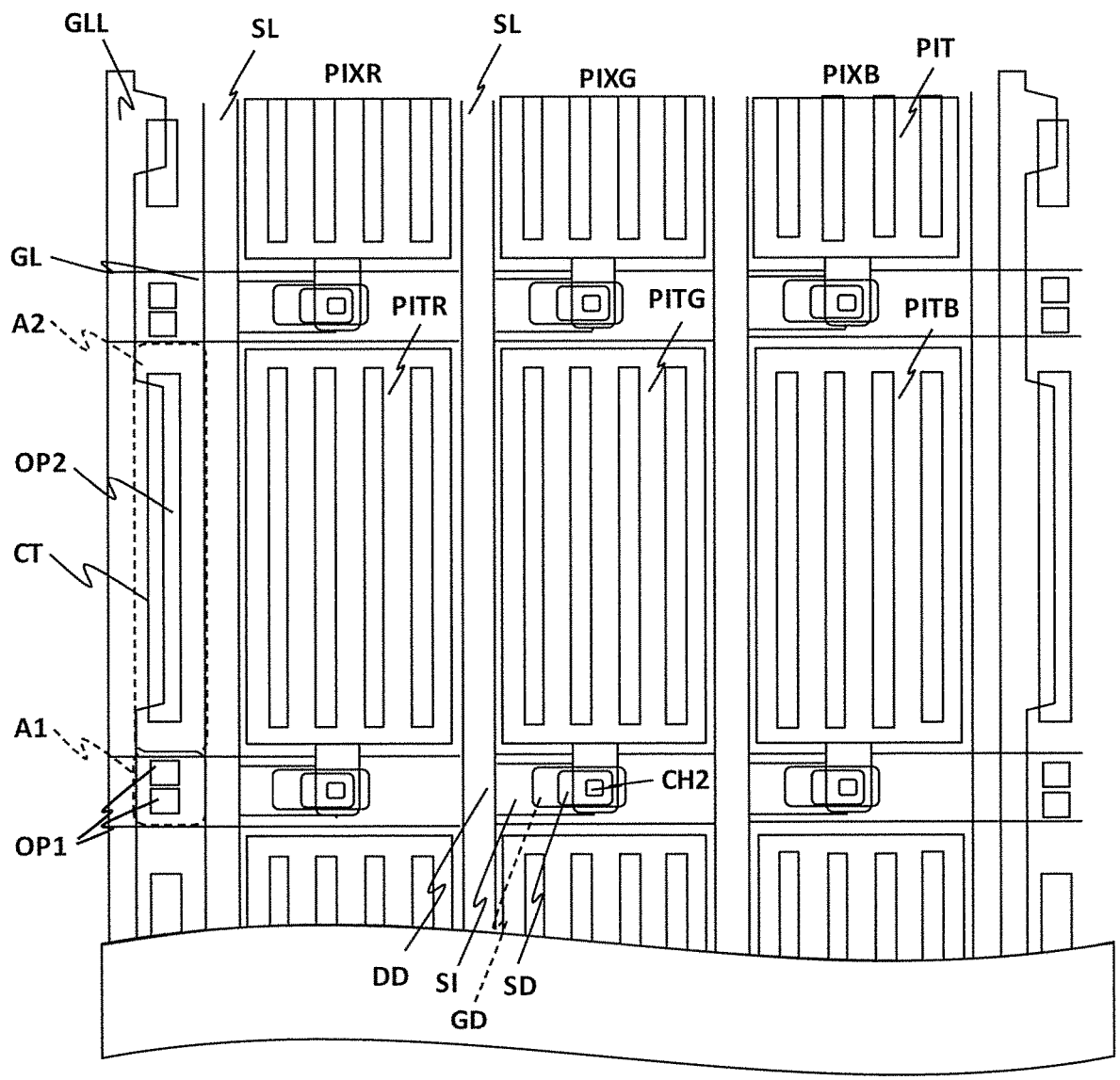
FIG. 5 is a plan view illustrating a configuration of a pixel in a second variation of the display device according to the exemplary embodiment.

As illustrated in FIGS. 1-3, the display device 1 includes a plurality of pixels PIX arranged in a matrix. The image display region DSP in which the image is displayed is constructed with the plurality of pixels PIX arranged in a matrix. A transistor TR, a pixel electrode PIT, and a common electrode CT are provided in each of the plurality of pixels PIX. The transistor TR is a thin film transistor, and includes gate electrode GD and a pair of conductive electrodes DD, SD. The pair of conductive electrodes are a drain electrode DD and a source electrode SD. It should be noted that the plan view of FIG. 2, as well as those of FIGS. 4 and 5, are transparent plan views that show the overlap of various features in different layers.

The display device 1 includes a plurality of gate signal lines GL extending in a first direction and a plurality of data signal lines SL extending in a second direction that is different from the first direction. In FIG. 1, the plurality of gate signal lines GL extend in a row direction and the plurality of data signal lines SL extend in a column direction.

The plurality of data signal lines SL are provided at a corresponding boundary between two pixels PIX adjacent to each other in the row direction. The plurality of gate signal lines GL are provided at a corresponding boundary between two pixels PIX adjacent to each other in the column direction. In this case, the plurality of pixels PIX are bounded by the plurality of data signal lines SL and the plurality of gate signal lines GL.

Each data signal line SL is connected to the plurality of transistors TR of pixels PIX arranged in the column direction. Specifically, each data signal line SL is connected to the drain electrodes DD of those transistors TR and may be integral with the drain electrodes DD as seen in FIG. 3.

Each gate signal line GL is connected to the plurality of transistors TR of the pixels PIX arranged in the row direction. Specifically, each gate signal line GL is connected to the gate electrodes GD of those transistors TR.

The display device 1 further includes a plurality of gate lead lines GLL extending in the column direction. The plurality of gate lead lines GLL are in parallel with the plurality of data signal lines SL and in a different direction, e.g. orthogonal, relative to the plurality of gate signal lines GL.

Each of the plurality of gate signal lines GL is electrically connected to at least one of the plurality of gate lead lines GLL. Specifically, each of the plurality of gate signal lines GL is electrically connected to a corresponding one of the plurality of gate lead lines GLL through a contact hole CH1 formed in an insulating layer.

In each pixel PIX, the source electrode SD of the transistor TR is electrically connected to a pixel electrode PIT. Each pixel electrode PIT faces a common electrode CT. In this embodiment, a single common electrode CT is provided over the plurality of pixels PIX. Specifically, single common electrode CT is provided over all the pixels PIX in the image display region DSP. That is, the common electrode CT is one planar electrode common to all pixels PIX, and is formed over entire image display region DSP. In each pixel PIX, a capacitor is formed between the pixel electrode PIT and the common electrode CT.

The plurality of data signal lines SL are connected to a source driver 20, and the plurality of gate signal lines GL are connected to a gate driver 30. The source driver 20 and the gate driver 30 are for example a driver integrated circuit (IC), and mounted on flexible print substrates as chip-on-film (COF). The flexible print substrate on which the source driver 20 is mounted is connected to terminals formed on a peripheral area that is outside of the image display region DSP, through an anisotropic conductive film.

In response to selection of gate signal lines GL by the gate driver 30, the source driver 20 supplies, to a corresponding data signal line SL, data voltage corresponding to the video signal input from an image processor (timing controller T-con) 40.

The gate driver 30 selects pixels PIX in which the video signal is written according to a timing signal input from image processor 40, and supplies gate-on voltage turning on the transistor TR of the selected pixel PIX to a gate signal line GL. Consequently, the data voltage is supplied to pixel electrodes PIT of selected pixels PIX through transistors TR.

In this way, when the gate-on voltage is supplied from the gate driver 30 to the gate signal line GL, transistors TR of selected pixels PIX are turned on, and the data voltage is supplied from a data signal line SL connected to transistor TR to a pixel electrode PIT. An electric field is generated in a liquid crystal layer LC due to a difference between the data voltage supplied to the pixel electrode PIT and the common voltage supplied to the common electrode CT. An alignment state of liquid crystal molecules of the liquid crystal layer in each pixel PIX is changed by the electric field, and transmittance of light of backlight BL passing through display device 1 is controlled in each pixel PIX. Consequently, the desired image is displayed in the display region (pixel region) of the display device 1.

FIG. 3 is a sectional view taken along a line in FIG. 2.

Referring to FIGS. 2 and 3, in the TFT substrate, a plurality of gate signal lines GL are formed on a transparent substrate SUB1. The gate signal lines GL are formed of a metallic material mainly containing aluminum (Al), molybdenum (Mo), titanium (Ti), or copper (Cu), or a plurality of laminated layers thereof. Mainly containing means that the stated material is the predominant material used for the element in question, i.e. the gate signal lines in this instance, preferably at least 50% by weight, more preferably at least 80% by weight. The same is true for other instances where mainly containing is used herein unless the context indicates otherwise. In one example of a metallic material mainly containing copper, the metallic material can include 87% copper, 5% molybdenum, and 5% titanium as the metal components (remainder miscellaneous).

A gate insulating layer GSN is formed so as to cover the plurality of gate signal lines GL. The gate insulating layer GSN can be made of silicon nitride SiN. Semiconductor layers SI are formed on the gate insulating layer GSN. The data signal line SL mainly containing copper Cu and the drain electrode DD and the source electrode SD, which constitute the thin film transistor TR, are formed on the semiconductor layer SI. The drain electrode DD is electrically connected to the data signal line DL.

The plurality of gate lead lines GLL are formed in a same layer as the plurality of data signal lines DL. That is to say, the plurality of gate lead lines GLL and the plurality of data signal lines DL are formed by patterning the same metal material.

An intermediate insulating layer PAS is formed so as to cover the plurality of gate lead lines GLL, the plurality of data signal lines DL, drain electrode DD and source electrode SD. The intermediate insulating layer PAS can be made of silicon nitride SiN or silicon dioxide $SiO_2$.

An organic insulating layer OPAS is formed on the intermediate insulating layer PAS. The organic insulating layer OPAS can include an acryl photosensitive organic material. The organic insulating layer OPAS can be thicker than the intermediate insulating layer PAS.

The common electrode CT is formed on the organic insulating layer OPAS. The common electrode CT is made of a transparent electrode material ITO. For example, the common electrode CT can be made of indium tin oxide or indium zinc oxide.

An upper insulating layer UPAS is formed so as to cover the common electrode CT. The upper insulating layer UPAS can be made of silicon nitride SiN. The plurality of pixel electrodes PIT are formed on the upper insulating layer UPAS. The plurality of pixel electrodes PIT are made of a transparent electrode material ITO. Each pixel electrode PIT is electrically connected to the source electrode SD through a contact hole CH2 formed in the upper insulating layer UPAS, the organic insulating layer OPAS and the intermediate insulating layer PAS. Although not illustrated, an alignment film is formed so as to cover the plurality of pixel electrodes PIT. A polarizing plate POL1 is formed on a side of the transparent substrate SUB1 facing a backlight BL. In the configuration of FIGS. 2 and 3, the common electrode CT is disposed in a lower layer while the pixel electrodes PIT are disposed in an upper layer. Alternatively, pixel electrodes PIT may be disposed in the lower layer while the common electrode CT is disposed in the upper layer.

In the CF substrate, colored portions and a black matrix BM are formed on the transparent substrate SUB2. For example, colored portions are formed by colored layers of red, green, and blue pigment-dispersion resists. In accordance with the colors of the colored portion, a plurality of pixels PIX consists of first pixels PIXR corresponding to a first color (red), second pixels PIXG corresponding to a second color (green) and third pixels PIXB corresponding to a third color (blue).

In addition, in accordance with the types of the pixels PIX, the plurality of pixel electrodes PIT includes first pixel electrodes PITR corresponding to a first color (red), second pixel electrodes PITG corresponding to a second color (green) and a third pixel electrode PITB corresponding to a third color (blue).

The black matrix BM is made of a metallic material or a resin material in which black pigment is filled. The black matrix BM is disposed in boundary areas between the plurality of pixels PIX. The black matrix BM overlaps with the plurality of data signal lines SL, the plurality of gate signal lines GL and the plurality of gate lead lines GLL.

An overcoat film OC is formed so as to cover the colored portions and the black matrix BM, and an alignment film is formed on the overcoat film OC. A polarizing plate POL2 is formed on a side of the transparent substrate SUB2 closer to an observer.

The gate lead lines GLL are provided in order to electrically connect the gate driver 30 to gate signal lines GL. The length of the gate lead line GLL influences a delay of gate signal from the gate driver. To improve the delay of gate signal, this embodiment reduces a capacitance between the gate signal line GL or the gate lead line GLL and the common electrode CT.

As shown in FIG. 2, one gate lead line GLL is provided for every three columns of pixels PIX while one data signal line SL is provided for every column of pixels PIX. The gate lead lines GLL in FIG. 2 are disposed between a column of pixels PIXB and the adjacent column of pixels PIXR. The gate lead lines GLL are not disposed between the column of pixels PIXR and the adjacent column of pixels PIXG or between the column of pixels PIXG and the adjacent column of pixels PIXB. In other words, the gate lead lines GLL are disposed between pixel electrodes PITB and pixel electrodes PITR. The gate lead lines GLL are not disposed between the pixel electrodes PITR and pixel electrodes PITG or between the pixel electrodes PITG and the pixel electrodes PITB.

On the other hand, the data signal lines SL are disposed between the column of pixels PIXB and the column of pixels PIXR, between the column of pixels PIXR and the column of pixels PIXG, and between the column of pixels PIXG and the column of pixels PIXB. In other words, the data signal lines SL are disposed between pixel electrodes PITB and pixel electrodes PITR, between pixel electrodes PITR and pixel electrodes PITG, and between pixel electrodes PITG and pixel electrodes PITB.

In addition, each gate lead lines GLL is disposed between two respective neighboring data signal lines SL. In this embodiment, each of the gate lead line GLL is disposed between a data signal line DL for a blue color and a data signal line DL for a red color, respectively. Although pixel electrodes PITB are disposed between a space between the gate lead line GLL and the data signal line SL for a blue color, no pixel electrodes are disposed between a space between the gate lead line GLL and the data signal line SL for a red color. In this case, the data signal line SL for a red color is the closest data signal line to the gate lead line GLL.

As shown in FIGS. 2 and 3, a first opening OP1 is provided in the common electrode CT in a first area A1 (shown with broken lines). The first area A1 overlaps one of the plurality of gate signal lines GL, and is between the one of a plurality of gate lead lines GLL and the data signal line SL closest to the one of a plurality of gate lead lines GLL. Namely, in the illustrated embodiment, the first area A1 is between the one of a plurality of gate lead lines GLL and a data signal lines DL for a red color. The first opening OP1 may have a rectangular shape with a longitudinal direction in the column direction.

The first opening OP1 is offset from both of the one of a plurality of gate lead lines GLL and the data signal line SL closest to the one of a plurality of gate lead lines GLL. In other words, the first opening OP1 does not overlap both the one of a plurality of gate lead lines GLL and the data signal line SL closest to the one of a plurality of gate lead lines GLL. In addition, the first opening OP1 is offset from the semiconductor layer SI.

A second opening OP2 is provided in the common electrode CT in a second area A2 (shown with broken lines). The second area A2 is between two neighboring gate signal lines GL among the plurality of gate signal lines GL in the column direction. The second opening OP2 at least partially overlaps with the one of a plurality of gate lead lines GLL. The second opening OP2 may have a rectangular shape with a longitudinal direction in the column direction.

The second opening OP2 extends from the one of a plurality of gate lead lines GLL that partially overlaps the second opening OP2 towards the data signal line SL closest to the one of a plurality of gate lead lines GLL. That is to say, the second opening OP2 at least partially covers an area between the one of a plurality of gate lead lines GLL and the data signal line SL closest to the one of a plurality of gate lead lines GLL.

In this embodiment, the first opening OP1 and the second opening OP2 are separate from each other. In other words, there is an uninterrupted portion of the common electrode CT between the first opening OP1 and the second opening OP2.

In addition, the black matrix BM covers the first opening OP1 and the second opening OP2.

According to this embodiment, the first opening OP1 occupies the first area A1 of the common electrode CT. Owing to this, it is possible to reduce a capacitance between the gate signal line GL and the common electrode CT, and to reduce the delay of the gate signal. In addition, the second opening OP2 occupies the second area A2 of the common electrode CT. Owing to this, it is possible to reduce a capacitance between the gate lead line GLL and the common electrode CT, and to reduce the delay of gate signal. The sizes of the first opening OP1 and the second opening OP2 may be set to provide the reduction in capacitance needed to provide the desired reduction in the delay of the gate signal. Each of the first openings may have the same size, or the sizes of the first openings may be varied to achieve different reductions in the delay of the gate signal if needed. The same is true for the second openings.

(Variations)

This present disclosure is not limited to above exemplary embodiment.

In above embodiment, although the first opening OP1 and the second opening OP2 are separate from each other, this present disclosure is not limited to this. FIG. 4 shows a plan view illustrating a first variation of the display device 1. In FIG. 4, the first opening OP1 communicates with the second opening OP2. Specifically, a plurality of first openings OP1 lead to a plurality of second openings OP2, which form continuous openings extending in the column direction.

In above embodiment, although a single first opening OP1 is provided in a single first area A1 of the common electrode CT, but is not limited to this. FIG. 5 shows a plan view illustrating a second variation of the display 1. In this variation, a plurality of first openings OP1 are provided in single first area A1 of the common electrode CT. In FIG. 5, two first openings OP1 are separate from each other, and are aligned in the column direction. Each first opening OP1 may have a rectangular shape with a longitudinal direction in the row direction.

In above embodiment, although the display device 1 is a liquid crystal display device, this present disclosure is not limited to this. the display device 1 can be another display device such as an organic light emitting display.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

What is claimed is:

1. A display device comprising:
   a plurality of gate signal lines extending in a first direction; and
   a plurality of data signal lines extending in a second direction different from the first direction;
   a plurality of gate lead lines extending in the second direction and respectively connected to a corresponding one of the plurality of gate signal lines;
   a plurality of pixel electrodes electrically connected to the plurality of data signal lines through a plurality of thin film transistors, respectively; and
   a common electrode opposed to the plurality of pixel electrode and extending across the plurality of pixel electrode,
   wherein each one of the plurality of gate lead lines is disposed between two neighboring ones of the plurality of data signal lines, and
   a first opening is provided for a first area of the common electrode, and the first area overlaps one of the plurality of gate signal lines, and is between the one of the plurality of gate lead lines and a one of the two neighboring data signal lines that is closer to the one of the plurality of gate lead lines than is the other one of the two neighboring data signal lines.

2. The display device according to claim 1, wherein the first opening is offset from both of the one of the plurality of gate lead lines and the one of the two neighboring data signal lines.

3. The display device according to claim 1, wherein the first opening has a longitudinal direction in the second direction.

4. The display device according to claim 1, wherein a plurality of first openings are provided for the first area.

5. The display device according to claim 1, wherein a second opening is provided for a second area of the common electrode, the second area being between two neighboring gate signal lines among the plurality of gate signal lines in the second direction, and
   the second opening at least partially overlaps with the one of the plurality of gate lead lines.

6. The display device according to claim 5, wherein the second opening has a longitudinal direction in the second direction.

7. The display device according to claim 5, wherein the first opening is in communication with the second opening.

8. The display device according to claim 1, further comprising:
   a black matrix covering the plurality of gate signal lines, wherein
   the black matrix covers the first opening.

9. The display device according to claim 1, wherein the plurality of pixel electrodes includes a plurality of first pixel electrodes corresponding to a first color, a plurality of second pixel electrodes corresponding to a second color and a plurality of third pixel electrodes corresponding to a third color, and
   each of the plurality of gate lead lines is disposed respectively between one of the first pixel electrodes and one of the third pixel electrodes, is not disposed between one of the first pixel electrodes and one of the second pixel electrodes, and is not disposed between one of the second pixel electrodes and one of the third pixel electrodes.

10. The display device according to claim 9, wherein the plurality of the data signal lines are disposed between one of the first pixel electrodes and one of the third pixel electrodes, between one of the first pixel electrodes and one of the second pixel electrodes, and between one of the second pixel electrodes and one of the third pixel electrodes, respectively.

* * * * *